United States Patent
Chan et al.

(10) Patent No.: US 8,710,500 B2
(45) Date of Patent: Apr. 29, 2014

(54) BIPOLAR JUNCTION TRANSISTOR WITH A SELF-ALIGNED EMITTER AND BASE

(71) Applicant: International Business Machines Corporation, Armonk, NY (US)

(72) Inventors: Kevin K. Chan, Staten Island, NY (US); Erik M. Dahlstrom, Santa Clara, CA (US); Peter B. Gray, Jericho, VT (US); David L. Harame, Essex Junction, VT (US); Qizhi Liu, Waltham, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/755,192

(22) Filed: Jan. 31, 2013

(65) Prior Publication Data

US 2013/0140566 A1   Jun. 6, 2013

Related U.S. Application Data

(62) Division of application No. 13/042,902, filed on Mar. 8, 2011, now Pat. No. 8,492,237.

(51) Int. Cl.
  *H01L 29/737*  (2006.01)
(52) U.S. Cl.
  USPC .......................................................... 257/51
(58) Field of Classification Search
  CPC ... H01L 29/737; H01L 29/772; H01L 29/786; H01L 29/94; H01L 29/76
  USPC ........................................... 257/51, 190, 197
  See application file for complete search history.

(56) References Cited

U.S. PATENT DOCUMENTS

| | | | |
|---|---|---|---|
| 6,680,235 B1 | 1/2004 | U'Ren et al. | |
| 6,716,711 B1 | 4/2004 | Racanelli | |
| 6,777,302 B1 | 8/2004 | Chen et al. | |
| 6,784,467 B1 | 8/2004 | Kalburge et al. | |
| 7,026,666 B2 | 4/2006 | Kalnitsky et al. | |
| 7,087,940 B2 | 8/2006 | Khater et al. | |
| 7,087,965 B2 | 8/2006 | Chan et al. | |
| 7,098,508 B2 | 8/2006 | Ieong et al. | |
| 7,119,416 B1 | 10/2006 | Adam et al. | |
| 7,253,096 B2 * | 8/2007 | Khater et al. | 438/623 |
| 7,687,887 B1 | 3/2010 | El-Diwany et al. | |
| 7,709,338 B2 | 5/2010 | Liu et al. | |
| 7,776,704 B2 | 8/2010 | Dunn et al. | |
| 8,084,795 B2 * | 12/2011 | Pan | 257/288 |
| 8,148,799 B2 | 4/2012 | El-Diwany et al. | |
| 2005/0151225 A1 * | 7/2005 | Adam et al. | 257/565 |

(Continued)

OTHER PUBLICATIONS

Nathan W. Ha, Examiner, USPTO, Office Action issued in related U.S. Appl. No. 13/042,902 dated Oct. 17, 2012.

(Continued)

*Primary Examiner* — Nathan Ha
(74) *Attorney, Agent, or Firm* — Wood, Herron & Evans LLP; Anthony J. Canale

(57) ABSTRACT

Methods for fabricating bipolar junction transistors with self-aligned emitter and extrinsic base, bipolar junction transistors made by the methods, and design structures for a BiCMOS integrated circuit. The bipolar junction transistor is fabricated using a sacrificial emitter pedestal that provides a sacrificial mandrel promoting self-alignment between the emitter and the extrinsic base. The sacrificial emitter pedestal is subsequently removed to open an emitter window extending to the intrinsic base. An emitter is formed in the emitter window that lands on the intrinsic base.

16 Claims, 11 Drawing Sheets

(56) References Cited

U.S. PATENT DOCUMENTS

2006/0231924 A1   10/2006  Adam et al.
2007/0087536 A1   4/2007   Chan et al.
2008/0121930 A1   5/2008   Adam et al.
2008/0128748 A1   6/2008   Iinuma
2008/0246057 A1   10/2008  Lin et al.
2009/0283801 A1*  11/2009  Pagette et al. ............... 257/190
2010/0187657 A1*  7/2010   Boeck et al. ................. 257/593
2012/0139009 A1   6/2012   Ning et al.

OTHER PUBLICATIONS

Donkers, et al., A Novel Fully Self-Aligned SiGe:C HBT Architecture Featuring a Single-Step Epitaxial Collector—Base Proces, 2007 IEEE.

Huylenbroeck, et al., A 400GHz fMAX Fully Self-Aligned SiGe:C HBT Architecture, 2008 IEEE.

Racanelli, et al., "Ultra High Speed SiGe NPN for Advanced BiCMOS Technology", IEEE IEDM Techn. Digest, pp. 336-339, Dec. 2001.

* cited by examiner

BIPOLAR JUNCTION TRANSISTOR WITH A SELF-ALIGNED EMITTER AND BASE

CROSS-REFERENCE TO RELATED APPLICATIONS

This application is a divisional of application Ser. No. 13/042,902, filed Mar. 8, 2011, which is hereby incorporated by reference herein in its entirety.

BACKGROUND

The invention relates generally to semiconductor device fabrication and, in particular, to bipolar junction transistors with a self-aligned emitter and base, as well as fabrication methods for bipolar junction transistors and design structures for BiCMOS integrated circuits.

Bipolar junction transistors are typically found in demanding types of analog circuits, especially analog circuits used in high-frequency applications. Bipolar junction transistors are found in radiofrequency integrated circuits (RFICs) used in wireless communications systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors include three semiconductor regions, namely the emitter, base, and collector regions. Generally, a bipolar junction transistor includes a pair of p-n junctions, namely an emitter-base junction and a collector-base junction. A bipolar junction transistor (HBT) is a variety of bipolar junction transistor that employs at least two semiconductor materials with unequal band gaps for the emitter and base regions, creating a heterojunction. For example, the base of a HBT may be comprised of silicon germanium (SiGe), which is characterized by a narrower band gap than silicon typically composing the emitter of the HBT.

Improved devices are needed for HBT's that boost device performance, as well as improved fabrication methods for HBT's and design structures for BiCMOS integrated circuits.

BRIEF SUMMARY

In an embodiment of the invention, a method is provided for fabricating a bipolar junction transistor. The method includes forming an intrinsic base layer, forming a sacrificial mandrel on a top surface of the intrinsic base layer, and forming an extrinsic base layer on the top surface of the intrinsic base layer. The extrinsic base layer is self-aligned with the sacrificial mandrel. The method further includes partially removing the sacrificial mandrel to define an emitter window to the top surface of the intrinsic base layer and forming an emitter in the emitter window that contacts the top surface of the intrinsic base layer.

In an embodiment of the invention, a method is provided for fabricating a bipolar junction transistor. The method includes forming trench isolation regions in the semiconductor substrate that surround a device region of a semiconductor substrate. A monocrystalline raised region of an intrinsic base layer is formed over the device region of the substrate. A polycrystalline region of the intrinsic base layer is formed over the trench isolation regions. The polycrystalline region includes a first sections and second sections of a lesser thickness than the first sections. The method further includes epitaxially growing an extrinsic base layer on a top surface of the intrinsic base layer using a selective epitaxial growth process. A portion of the extrinsic base layer is selectively grown on the polycrystalline region of the intrinsic base layer and fills open spaces between the second sections of the polycrystalline region that the polycrystalline region has a substantially planar top surface.

In an embodiment of the invention, a device structure for a bipolar junction transistor includes an intrinsic base and an extrinsic base on the top surface of the intrinsic base. An emitter window extends through extrinsic base and to a raised region of the intrinsic base. Spacers line the emitter window. An emitter is in contact with the intrinsic base. The emitter is disposed in the emitter window and separated from the extrinsic base by the spacers. The spacers lining the emitter window function to self-align the extrinsic base with the emitter.

In an embodiment of the invention, a hardware description language (HDL) design structure is encoded on a machine-readable data storage medium. The HDL design structure comprises elements that, when processed in a computer-aided design system, generates a machine-executable representation of a bipolar junction transistor. The HDL design structure includes an intrinsic base and an extrinsic base on the top surface of the intrinsic base. An emitter window extends through extrinsic base and to a raised region of the intrinsic base. Spacers line the emitter window. An emitter is in contact with the intrinsic base. The emitter is disposed in the emitter window and separated from the extrinsic base by the spacers. The spacers lining the emitter window function to self-align the extrinsic base with the emitter. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
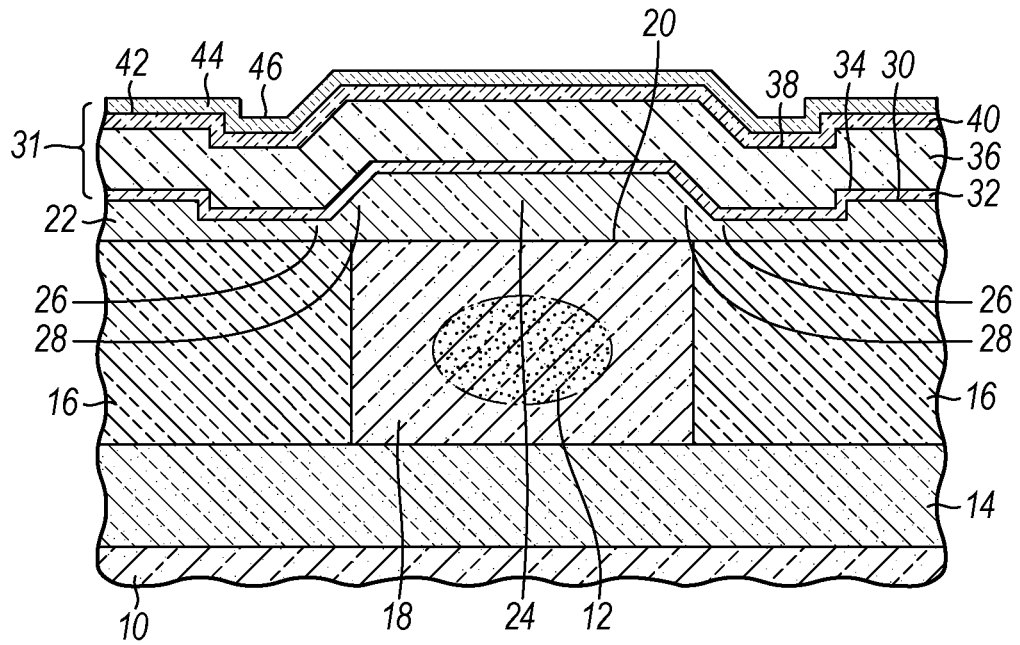
FIGS. 1-9 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 is comprised of a semiconductor material. Substrate 10 may be any suitable bulk substrate containing a semiconductor material that a person having ordinary skill in the art would recognize as suitable for forming an integrated circuit. For example, substrate 10 may be comprised of a monocrystalline silicon-containing material, such as single crystal silicon with a (100) crystal lattice orientation. The monocrystalline semiconductor material contained in the substrate 10 may contain a definite defect concentration and still be considered single crystal. The semiconductor material constituting substrate 10 may be lightly doped with an impurity to alter its electrical properties. Specifically, the substrate 10 may be lightly doped with a p-type impurity species, such as boron, to render it initially p-type.

Figure 9:
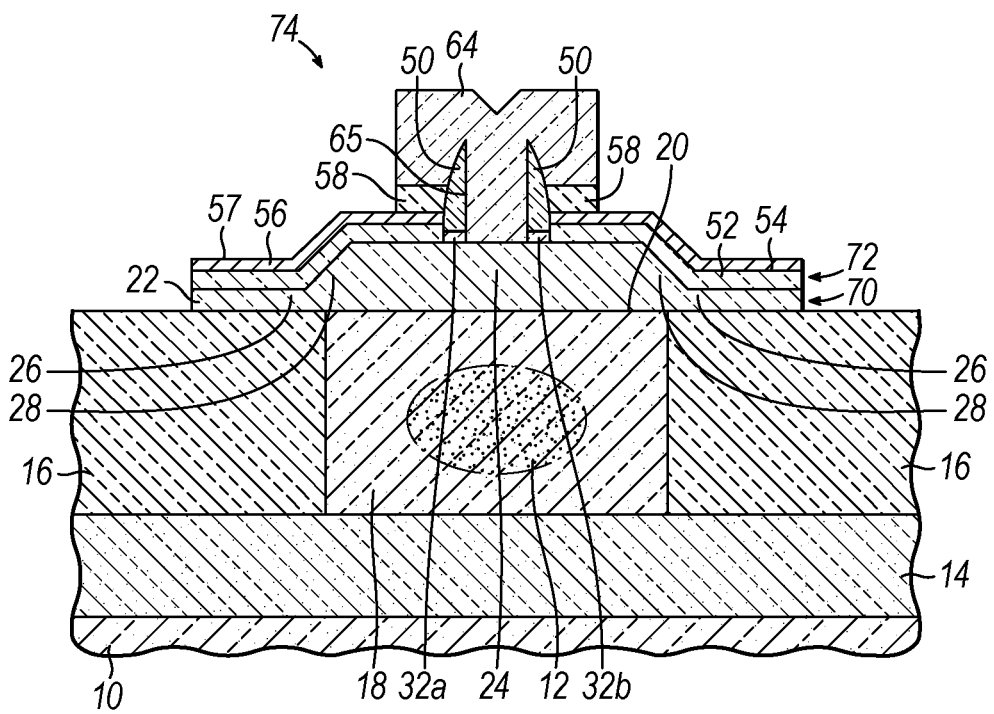

Trench isolation regions 16 are formed by a conventional process in the substrate 10. In one embodiment, the trench isolation regions 16 may be formed by a shallow trench isolation (STI) technique that relies on a lithography and dry etching process to define closed-bottomed trenches in substrate 10, fills the trenches with dielectric, and planarizes the layer to a top surface 20 of the substrate 10 using a chemical mechanical polishing (CMP) process. The dielectric may be an oxide of silicon, such as densified tetraethylorthosilicate (TEOS) deposited by chemical vapor deposition (CVD) or a high-density plasma (HDP) oxide deposited with plasma assistance. The trench isolation regions 16 circumscribe and electrically isolate a device region 18 of the substrate 10 that is used in the fabrication of the bipolar junction transistor 74 (FIG. 9).

A collector region 12 and a subcollector 14 of a bipolar junction transistor 74 (FIG. 9) are defined as impurity-doped regions in the substrate 10. The collector region 12 and subcollector 14 are doped with different concentrations of an electrically-active dopant, such as an impurities species from Group V of the Periodic Table (e.g., arsenic) effective to impart an n-type conductivity in which electrons are the majority carriers and dominate the electrical conductivity of the semiconductor material. The collector region 12 and the subcollector 14 may be formed by ion implantation of an n-type dopant and annealing to activate the dopant using techniques and conditions familiar to one skilled in the art. For example, the collector region 12 may comprise a selectively implanted collector (SIC) formed by implanting, for example, an n-type dopant with selected dose and kinetic energy in the central part of the device region 18, and may be formed at any appropriate point in the process flow.

A layer 22, which is comprised of a material suitable for forming an intrinsic base of the bipolar junction transistor 74, is deposited on the top surface 20 of substrate 10 and, in particular on the top surface 20 of the device region 18 of substrate 10. Intrinsic base layer 22 may be formed using a low temperature epitaxial (LTE) growth process (typically at a growth temperature ranging from 400° C. to 850° C.). Intrinsic base layer 22 may be comprised of a semiconductor material $Si_xGe_{1-x}$ including silicon (Si) and germanium (Ge) with the germanium content ranging from about 5 atomic percent and about 50 atomic percent. The germanium content of the intrinsic base layer 22 may be uniform or the germanium content of intrinsic base layer 22 may be graded or stepped across the thickness of intrinsic base layer 22. Layer 22 may be doped with boron and/or carbon.

Intrinsic base layer 22 includes a monocrystalline raised region 24 laterally positioned in vertical alignment with the collector region 12 and device region 18 of the substrate 10, a polycrystalline region 26 surrounding the raised region 24 and overlying a portion of the trench isolation regions 16 near the raised region 24, and a facet region 28 connecting the raised region 24 and the polycrystalline region 26. Intrinsic base layer 22 may be either a mixture of polycrystalline and monocrystalline in facet region 28 or primarily monocrystalline in facet region 28. The thickness of the intrinsic base layer 22 may range from about 10 nm to about 600 nm with the largest layer thickness in the raised region 24. As the thickness of intrinsic base layer 22 increases, the width of the raised region 24 likewise increases so that the facet region 28 moves laterally outward relative to the centerline of the raised region 24.

A sacrificial layer stack, generally indicated by reference numeral 31, is formed on intrinsic base layer 22. The layer stack 31 includes layers 32, 36, 40, 44 that are serially deposited on intrinsic base layer 22.

Layer 32, which contains a material with a different composition than intrinsic base layer 22, is deposited on a top surface 30 of intrinsic base layer 22 and directly contacts the top surface 30. Layer 32 may be comprised of a dielectric, which is an insulating material having a dielectric constant (e.g., permittivity) characteristic of a dielectric material. In one embodiment, layer 32 may be a high temperature oxide (HTO) deposited using low pressure chemical vapor deposition (LPCVD) at temperatures of 500° C. or higher, and may be comprised of an oxide of silicon, such as stoichiometric silicon dioxide ($SiO_2$). Alternatively, the material of layer 32 may be deposited or grown by another suitable deposition process.

Layer 36, which contains a material with a different composition than layer 32, is deposited on a top surface 34 of layer 32 and directly contacts the top surface 34. Layer 36 may be comprised of a material with a different etching selectivity than the underlying layer 32. In one embodiment, layer 36 may be comprised of polycrystalline silicon (e.g., polysilicon) deposited by a conventional deposition process such as low pressure chemical vapor phase deposition (LPCVD) using either silane or disilane as a silicon source or physical vapor deposition (PVD). In the representative embodiment, layer 36 has the largest layer thickness among layers 32, 36, 40.

Layer 40, which contains a material with a different composition than layer 32 and a different composition than layer 36, is deposited on a top surface 38 of layer 36 and directly contacts the top surface 38. Layer 40 may be comprised of a dielectric material with a different etching selectivity than the underlying layer 36. In one embodiment, layer 40 may be comprised of silicon nitride ($Si_3N_4$) deposited using CVD. Alternatively, the material of layer 40 may be deposited by another suitable deposition process.

Layer 44, which contains a material with a different composition than layer 40 and which may contain the same material as layer 32, is deposited on a top surface 42 of layer 40 and directly contacts the top surface 42. Layer 44 may be comprised of a dielectric material with a different etching selectivity than the underlying layer 40. In one embodiment, layer 36 may be comprised of $SiO_2$ deposited by CVD. Alternatively, layer 44 may be deposited by another suitable deposition process.

In an alternative embodiment of layer stack 31, layer 44 may omitted and layer 40 may be present. In another alternative embodiment of layer stack 31, layer 40 may omitted and layer 44 may be present.

Figure 2:
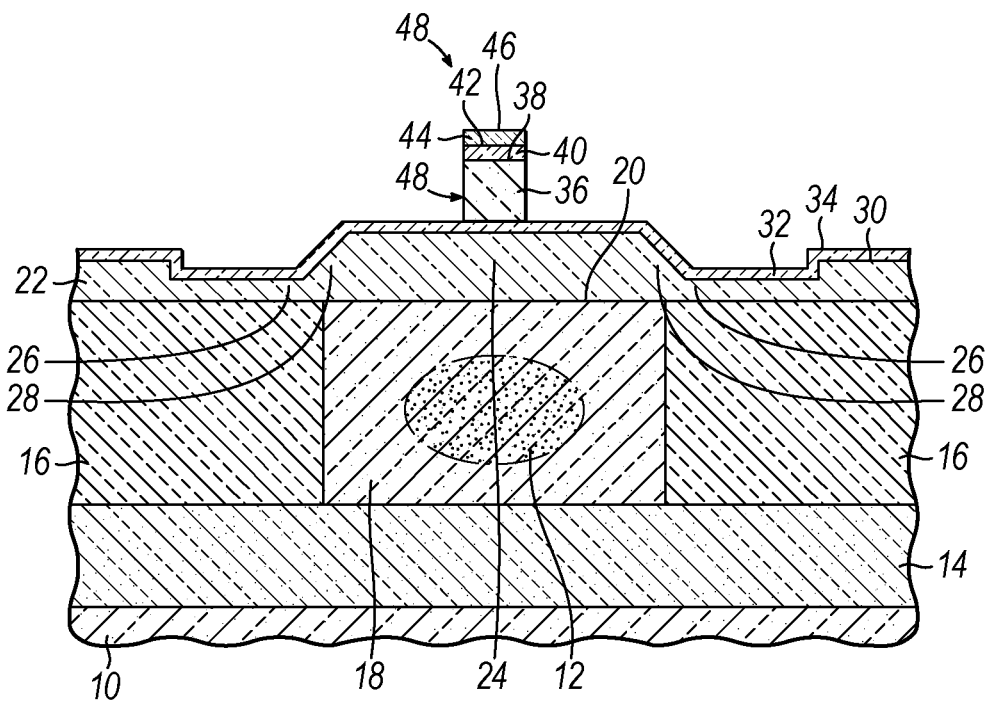

With reference to FIG. 2 in which like reference numerals refer to like features in FIG. 1 and at a subsequent fabrication stage, layers 36, 40, 44 of the layer stack 31 are patterned using photolithography and subtractive etching processes to define a sacrificial mandrel in the form of a sacrificial emitter pedestal, generally indicated by reference numeral 48. To that end, the layer stack 31 is masked with a patterned mask layer (not shown). In one embodiment, the mask layer may be a photoresist layer comprised of a sacrificial organic material applied to the top surface 46 of layer 44 by spin coating. The photolithography process entails exposing the photoresist layer to radiation imaged through a photomask and developing the resultant latent feature pattern in the exposed resist to define residual areas of photoresist that mask portions of layer stack 31. In particular, the mask includes an island covering a surface area of a top surface 46 of layer 44 at the intended location of the sacrificial emitter pedestal 48.

A subtractive etching process, such as a reactive-ion etching (RIE) process, is used to remove regions of layers 36, 40, 44 not protected by the mask layer. For example, an initial segment of the etching process removes the unprotected regions of layer 44 and stops on the material of layer 40. The etch chemistry may be changed to remove the unprotected regions of the underlying layer 40 and stop on the material of layer 36. The etch chemistry is changed again to remove the unprotected regions of the underlying layer 36 and stop on the material of layer 32. At the conclusion of the subtractive etching process, the top surface 34 of layer 32 is exposed aside from the portion of the top surface 34 covered by the sacrificial emitter pedestal 48.

Figure 3:
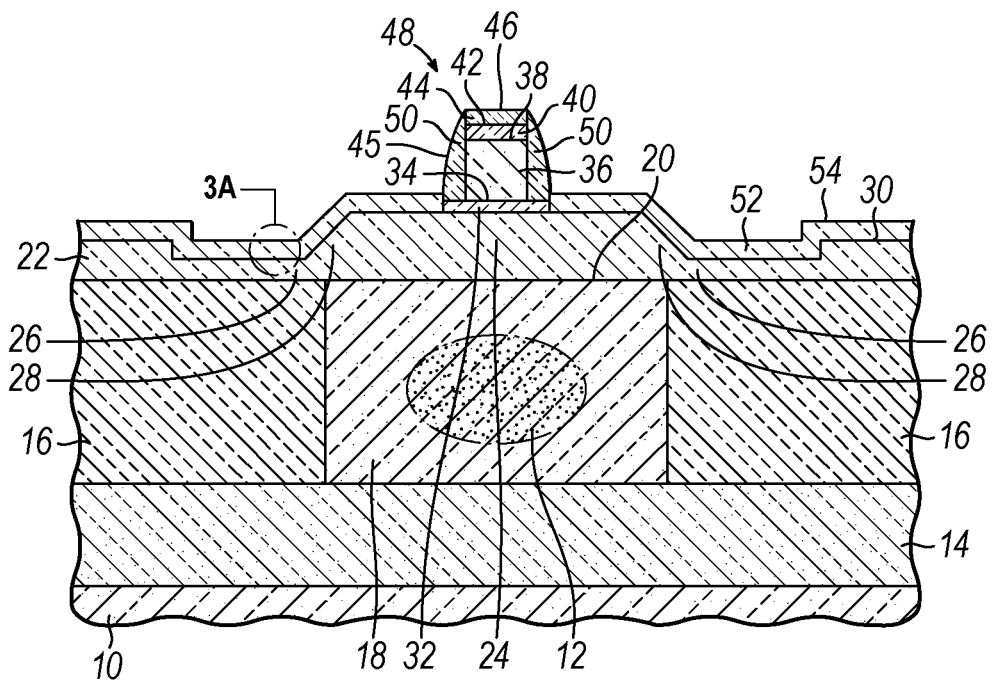

With reference to FIG. 3 in which like reference numerals refer to like features in FIG. 2 and at a subsequent fabrication stage, spacers 50 are formed on the sidewalls of the layers 36, 40, 44 of sacrificial emitter pedestal 48. In a representative embodiment, the spacers 50 of sacrificial emitter pedestal 48 may be formed from a layer (not shown) of a non-conductive, dielectric material deposited on layer 32 and then shaped by a directional anisotropic etching process, such as a RIE process, to preferentially remove the constituent dielectric material from horizontal surfaces. The dielectric material may be a thin layer of $Si_3N_4$ deposited by CVD. Prior to the performance of the etching process and for a BiCMOS chip, an etch mask (not shown) may be applied so that the dielectric layer remained on surface areas of the substrate 10 outside of the vicinity of the surface area on which the sacrificial emitter pedestal 48 and other similar sacrificial emitter pedestals are disposed.

The top surface 30 of intrinsic base layer 22 is exposed by an etching process that removes the material of layer 32 and stops on the material constituting intrinsic base layer 22. The etching process may be chemical oxide removal (COR) that removes the material of layer 32, if comprised of $SiO_2$, with minimal undercut beneath the sacrificial emitter pedestal 48. A COR process utilizes a vapor or, more preferably, a mixture flow of hydrogen fluoride (HF) and ammonia ($NH_3$) in a ratio of 1:10 to 10:1 and may be performed at low pressures (e.g., of about 1 mTorr to about 100 mTorr) and room temperature. A surface area of layer 32 is covered by the sacrificial emitter pedestal 48 and is therefore protected during the etching process. The COR process may be performed in situ in the deposition chamber or may be performed in an independent chamber. Layer 44 is also removed, or only partially removed, from the layer stack 31 by the etching process. An optional hydrofluoric acid chemical cleaning procedure may follow the COR process.

A layer 52, which supplies the semiconductor material for an extrinsic base, is formed on the top surface 30 of the intrinsic base layer 22. The extrinsic base layer 52 may be comprised of the same material (e.g., $Si_xGe_{1-x}$ or Si) as intrinsic base layer 22 and is grown by a selective epitaxial growth (SEG) process. Alternatively, the materials comprising intrinsic base layer 22 and extrinsic base layer 52 may differ. Extrinsic base layer 52 is doped in situ during epitaxial growth with a concentration of a dopant, such as an impurity species from Group III of the Periodic Table (e.g., boron) effective to impart a p-type conductivity. The SEG process is usually performed at a sub-atmospheric process pressure (e.g., 40 torr) and typically with a substrate temperature between about 400° C. and about 750° C. The growth temperature may be at the lower end of the range if the extrinsic base layer 52 is comprised of $Si_xGe_{1-x}$. Growth is not initiated during the SEG process on the outer surfaces of the sacrificial emitter pedestal 48 so that the sacrificial emitter pedestal 48 remains uncovered by the material of extrinsic base layer 52, nor surface areas on substrate 10 covered by the dielectric layer used to form spacers 50 and outside of the surfaces areas on which the extrinsic base layer 52 is needed to form bipolar junction transistors on a BiCMOS chip.

The material in the extrinsic base layer 52 is ultimately used to form an extrinsic base 72 (FIG. 9) arranged over the intrinsic base 70 formed from intrinsic base layer 22. During the selective growth process, the semiconductor material of the raised region 24 and facet region 28 of intrinsic base layer 22 operates as a seed crystal or crystalline seed that establishes a crystallographic pattern for the semiconductor material of the extrinsic base layer 52 grown on the raised region 24. The crystallographic pattern of the raised region of intrinsic base layer 22 is reproduced during selective epitaxy in extrinsic base layer 52 over raised region 24 and facet region 28 so that this region of the extrinsic base layer 52 has the same lattice structure and crystalline orientation as intrinsic base layer 22. Another region of the extrinsic base 72, which is disposed over the trench isolation regions 16, is comprised of polycrystalline semiconductor material also formed by the selective epitaxy.

The outer surface of the spacers 50 defines a periphery or perimeter 45 of the sacrificial emitter pedestal 48. The spacers 50 project vertically from the top surface 30 of the intrinsic base layer 22. The extrinsic base layer 52 is formed about the spacers 50 of sacrificial emitter pedestal 48. As a result, the extrinsic base layer 52 smoothly terminates at the perimeter 45 of the spacers 50 of the sacrificial emitter pedestal 48. The sacrificial emitter pedestal 48 projects through and above the extrinsic base layer 52. Eventually, the extrinsic base 72 (FIG. 9) formed from the extrinsic base layer 52 is self-aligned with the emitter 64 (FIG. 9) because of the presence of the sacrificial emitter pedestal 48 when the extrinsic base layer 52 is formed.

Figure 3A:
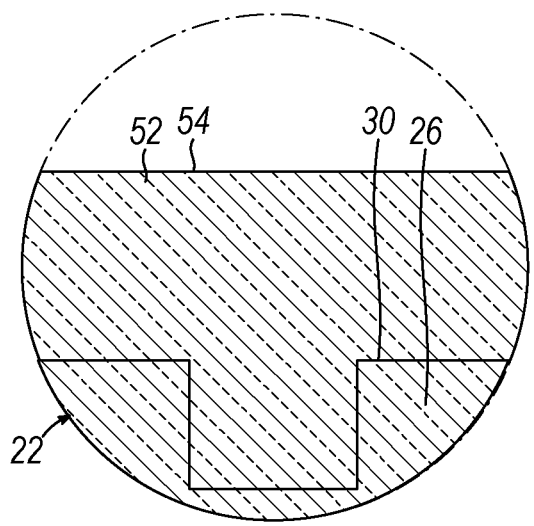
FIG. 3A is a detailed view of a portion of FIG. 3 after the extrinsic base layer is formed.
Figure 3B:
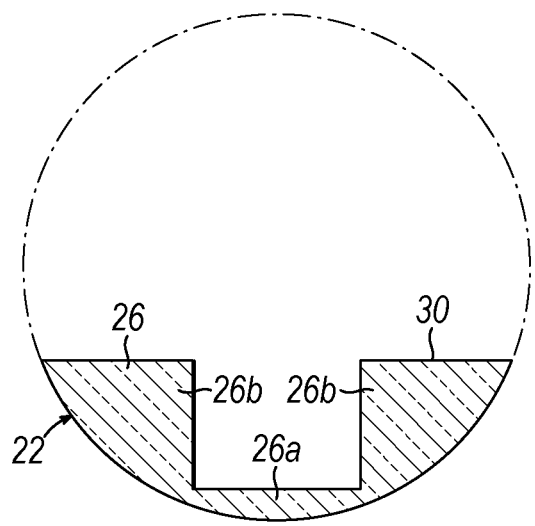
FIG. 3B is a detailed view similar to FIG. 3A before the extrinsic base layer is formed.

As apparent in FIG. 3A, the portion of the extrinsic base layer 52 formed on the polycrystalline region 26 of intrinsic base layer 22 by the SEG process has a smooth and continuous surface morphology in comparison with the texture of polycrystalline region 26 prior to the selective epitaxy of extrinsic base layer 52. Prior to the formation of extrinsic base layer 52, the polycrystalline region 26 exhibits a texturing or roughness that may include regions of different thickness resulting an uneven, non-uniform layer thickness, as apparent in FIG. 3B. For example, the polycrystalline region 26 of intrinsic base layer 22 may includes thin sections 26a of relatively small layer thickness and thick sections 26b of relatively large layer thickness. Adjacent thick sections 26b are separated by open spaces. The polycrystalline region 26 may provide complete unbroken coverage of the top surface 20 of substrate 10. Alternatively, the thin sections 26a may be absent or thinned to an extent that the thick sections 26b form discrete and separated islands and the top surface 20 of substrate 10 is partially exposed between adjacent islands.

The existing material of the polycrystalline region 26 operates as a scarce seed layer to promote the selective epitaxy of polycrystalline material from extrinsic base layer 52. Material from extrinsic base layer 52 fills open spaces between the thick sections 26b in the polycrystalline region 26, thickens the intrinsic base layer 22 of polycrystalline region 26 with additional polycrystalline material, ultimately provides a substantially uniform layer thickness in the polycrystalline region 26, and smoothes or flattens the top surface 30 of layer 22 in the thickened polycrystalline region 26, as apparent in FIG. 3A. The flattening and smoothing may be most pronounced when the extrinsic base layer 52 is comprised of $Si_xGe_{1-x}$. The improvement in the physical properties of the polycrystalline region 26 promotes a substantially uniform layer thickness for the portion of the extrinsic base layer 52 on the polycrystalline region 26 and smoothes or flattens the top surface 54 of extrinsic base layer 52 overlying the polycrystalline region 26 so that the top surface 54 is substantially planar and does not acquire the topology of the rough surface existing prior to formation of the extrinsic base layer 52. As a result, the composite layer consisting of the polycrystalline region 26 of intrinsic base layer 22 and the portion of extrinsic base layer 52 on the polycrystalline region 26 has a more uniform thickness and is smoother or flatter than observed in conventional device constructions.

The continuous and flattened nature of the extrinsic base layer 52 over the polycrystalline region 26 promotes the formation of a silicide layer 56 in a subsequent fabrication stage that is continuous and smooth. The silicide layer 56 (FIG. 4) may be employed in a subsequent fabrication stage to produce a base contact.

Figure 4:
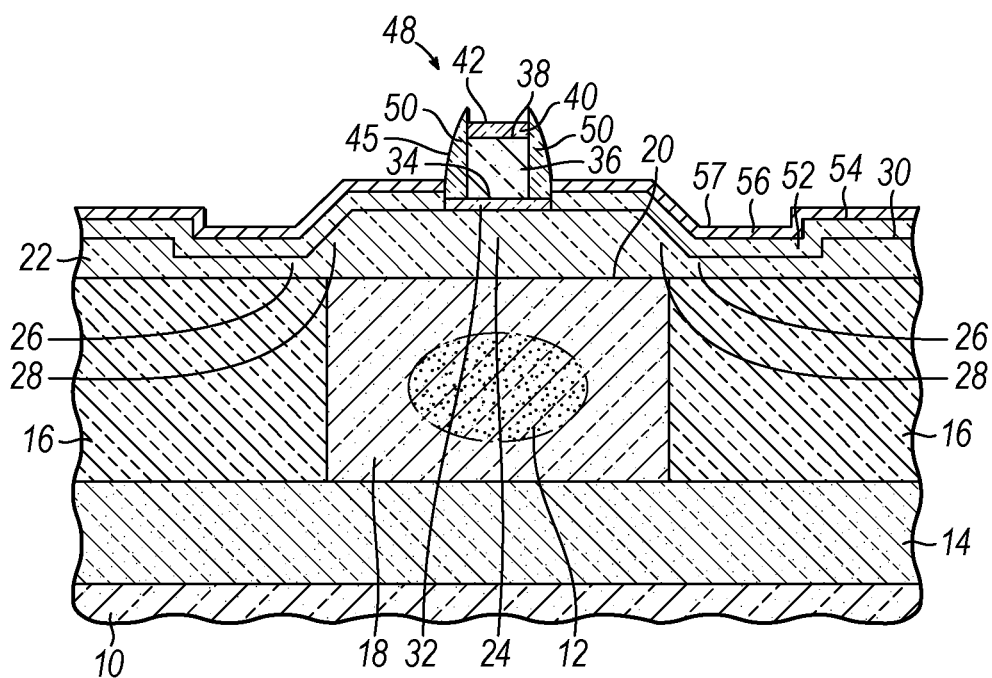

With reference to FIG. 4 in which like reference numerals refer to like features in FIG. 3 and at a subsequent fabrication stage, a silicide layer 56 is formed that consumes part of the extrinsic base layer 52 during formation. To this end, a conformal layer (not shown) of a silicide-forming metal is formed on the top surface 54 of extrinsic base layer 52 and over the sacrificial emitter pedestal 48 and spacers 50. The layer of silicide-forming metal may be a blanket layer deposited by, for example, a CVD process or a physical vapor deposition (PVD) process. In various embodiments, candidate refractory metals for the silicide-forming metal include, but are not limited to, titanium (Ti), cobalt (Co), or nickel (Ni), each of which has a sintering temperatures of 900° C. or less, exhibits stability on silicon up to a temperature of 950° C., is characterized by a resistivity in a range of 10 μΩ-cm to 20 μΩ-cm, and is thermally stable during subsequent processing steps. Preferably, the silicide in the silicide layer 56 represents the lowest resistivity phase of the particular metal silicide and is thermally stable at temperatures of subsequent processing steps. A capping layer (not shown) comprised of a metal nitride, such as titanium nitride (TiN) deposited by direct current (DC) sputtering or radio frequency (RF) sputtering, may be applied to the layer of silicide-forming metal.

A silicidation process is employed that involves one or more annealing steps to form a silicide phase. The silicide phase constituting silicide layer 56 may be characterized as a silicon-germanium silicide contingent upon the composition of extrinsic base layer 52. In a representative silicidation process, the metal and semiconductor material (e.g., Si or SiGe) are thermally reacted to an intermediate silicide material. The formation anneal is performed employing ambients and temperatures well known in the art that cause the reaction between the metal and semiconductor material. For example, the silicidation process may be conducted in an ambient consisting an inert gas such as nitrogen atmosphere, and by heating the silicide-forming metal utilizing one or more rapid thermal annealing (RTA) steps at an annealing temperature, which is contingent on the type of silicide, of about 400° C. to about 900° C. In silicidation processes, metal-rich silicides initially form and continue to grow until the metal is consumed. When the metal layer has been consumed, silicides of lower metal content begin to appear and can continue to grow by consuming the metal-rich silicides.

Following the formation anneal, any metal not converted into silicide and the capping layer may be removed with, for example, selective wet chemical etch processes. The wet chemical etch process for removing the unconverted metal may utilize, for example, a $H_2O_2/H_2SO_4$ solution or a $HNO_3/HCl$ solution. The wet chemical etch process for removing the capping layer, if comprised of TiN, may utilize a $HNO_3/HF$ solution or a mixture of $NH_4OH:H_2O_2:H_2O$ (SC1 solution).

After the unconverted metal and capping layer are removed, the silicide layer 56 may be subjected to another anneal process to form a lower-resistance phase for the specific silicide used in layer 56. The temperature for the transformation anneal of the silicide layer 56 may be higher than the temperature of the formation anneal.

Figure 8:
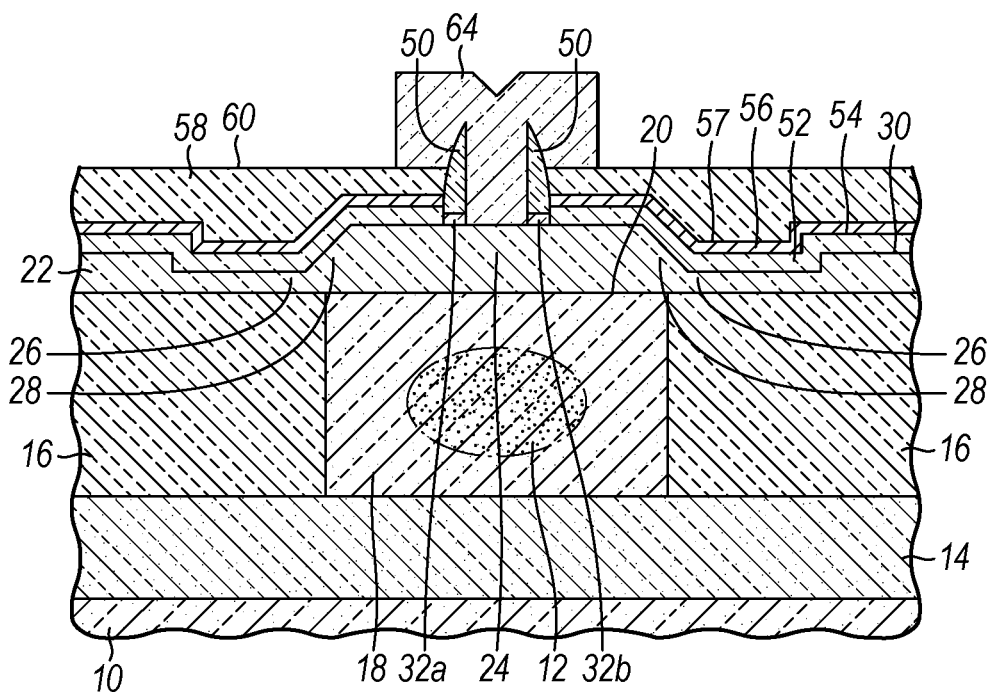

The silicide layer 56 is formed about the sacrificial emitter pedestal 48, which does not support growth of the material constituting the silicide layer 56. As a result, the silicide layer 56 smoothly terminates at the perimeter 45 of the sacrificial emitter pedestal 48 and the sacrificial emitter pedestal 48 projects through and above the silicide layer 56. These spatial relationships between the silicide layer 56 and the sacrificial emitter pedestal 48 provide the self-alignment between silicide layer 56 and the emitter 64 (FIG. 8). Because the same structure (i.e., the sacrificial emitter pedestal 48) is used during self-alignment, the silicide layer 56 and extrinsic base 72 are both self-aligned relative to the emitter 64.

Formation of the silicide layer 56, as described above, is optional. In an alternative embodiment, a silicide layer similar to silicide layer 56 may be formed at a later stage of the process flow together with silicide for other devices including the source and drain of CMOS FETs and the collector of the bipolar junction transistor 74 (FIG. 9). The silicide layer 56 or the later formed silicide layer (not shown) functions to lower the base resistance of bipolar junction transistor 74.

In an alternative embodiment, a separate layer of silicon-containing material may be deposited on the top surface 54 of extrinsic base layer 52 before the conformal layer (not shown) of silicide-forming metal is formed. This separate silicon-containing layer is used to form the silicide layer 56 without consuming a significant thickness of extrinsic base layer 52.

Figure 5:
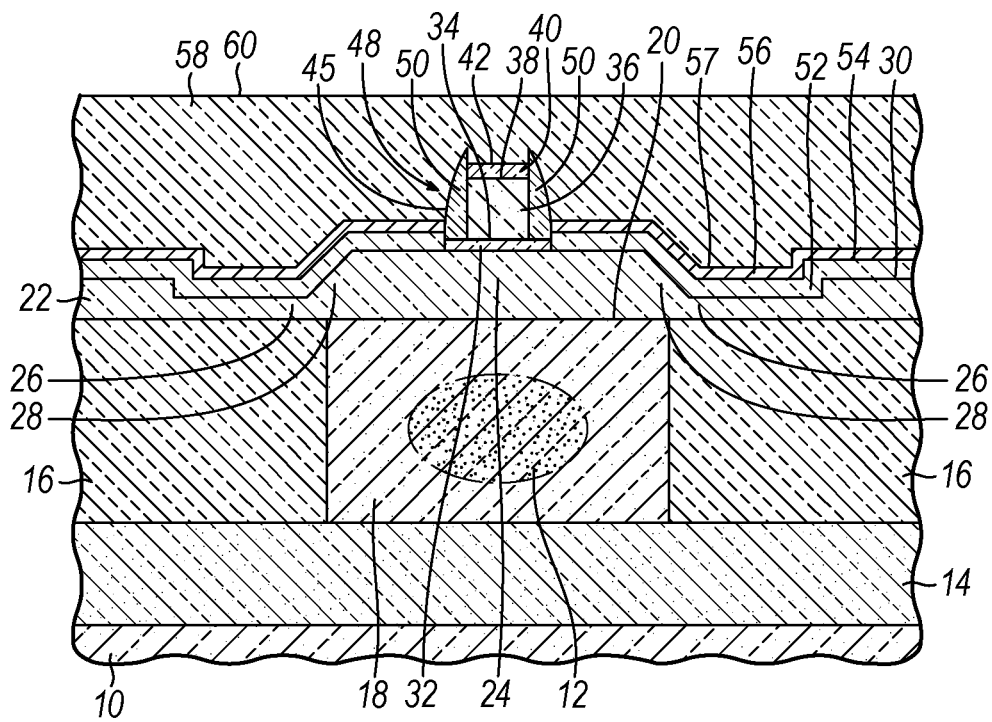

With reference to FIG. 5 in which like reference numerals refer to like features in FIG. 4 and at a subsequent fabrication stage, an insulating layer 58 of a relatively large layer thickness is deposited that buries the sacrificial emitter pedestal 48. The insulating layer 58 may be comprised of a dielectric, which is an insulating material having a dielectric constant (e.g., permittivity characteristic of a dielectric material). In one embodiment, insulating layer 58 may be comprised of $SiO_2$ formed by plasma-enhanced CVD (PECVD) or another suitable deposition process. A top surface 60 of the insulating layer 58 is planarized using a chemical-mechanical polishing (CMP) process so that the top surface 60 is flat. The CMP process combines abrasion and dissolution to remove a thickness of the insulating layer 58 so that gross non-planar topology of the top surface 60 from the presence of the sacrificial emitter pedestal 48 is reduced and the top surface 60 is flattened. The CMP process is controlled such that the sacrificial emitter pedestal 48 remains buried.

Figure 6:
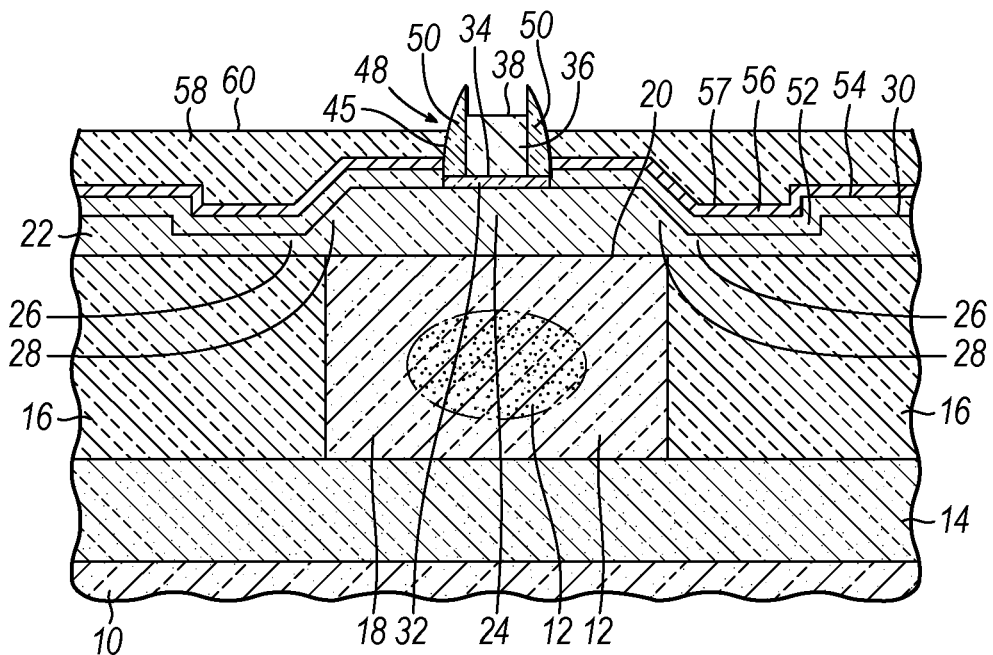

With reference to FIG. 6 in which like reference numerals refer to like features in FIG. 5 and at a subsequent fabrication stage, the top surface 60 of insulating layer 58 is further recessed relative to the sacrificial emitter pedestal 48 by an etching process, such as RIE. The conditions for the etching process are selected such the material of insulating layer 58 is removed selectively (i.e., at a higher etch rate) to the material of layer 40 (FIG. 5) atop the sacrificial emitter pedestal 48. At the conclusion of the etching process, layer 40 is exposed and then removed from its position between the spacers 50 to expose the top surface 38 of layer 36 of the sacrificial emitter pedestal 48. Layer 40 may be removed using a hot phosphoric acid etch or RIE with a suitable etch chemistry. The height of the spacers 50 may be reduced during the removal of layer 40.

Figure 6A:
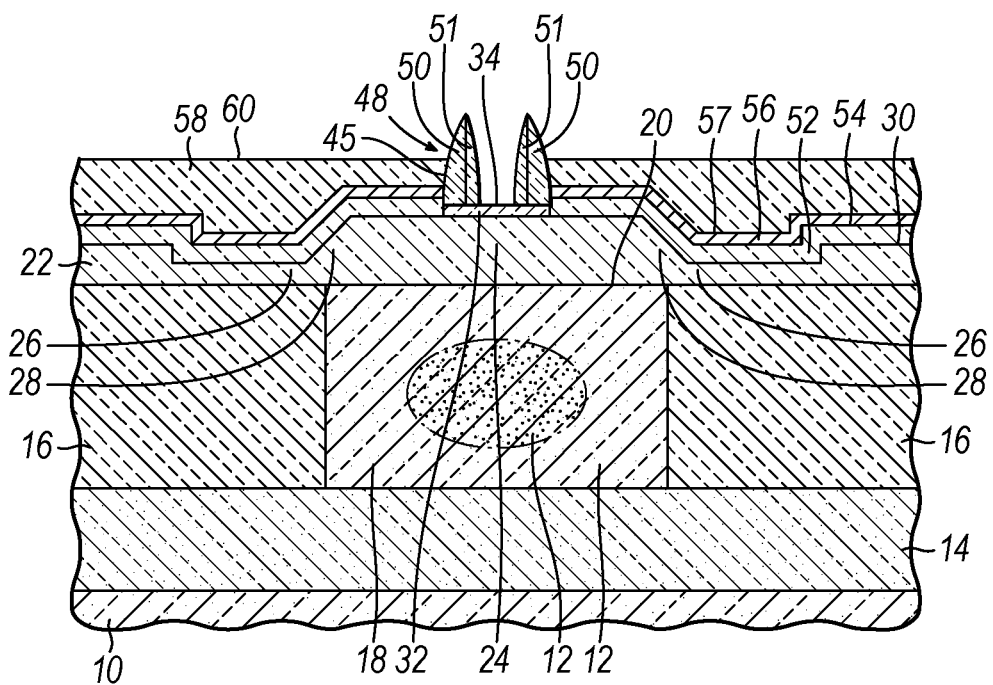
FIGS. 6A and 6B are cross-sectional views similar to FIG. 6 in accordance with alternative embodiments of the invention.

With reference to FIG. 6A in which like reference numerals refer to like features in FIG. 6 and in accordance with an alternative embodiment, additional spacers 51 may be formed inside the emitter window 62 (FIG. 7) on the spacers 50. The spacers 51 may be formed from a dielectric material and in a manner similar to the construction of spacers 50. The spacers 51 are formed after layer 36 is removed from the layer stack of the sacrificial emitter pedestal 48 but prior to the removal of layer 32 from the layer stack. The COR process used in an earlier step of the process flow (FIG. 3) to remove layer 32 and/or the hydrofluoric acid chemical cleaning procedure following the COR process may undercut the spacers 50. The addition of spacers 51 increases the effective thickness of dielectric material between the extrinsic base 72 (FIG. 9) and emitter 64 (FIG. 8), especially if the spacers 50 are undercut, so that tunneling is reduced. The process flow would continue as described below in connection with FIGS. 7-9.

Figure 6B:
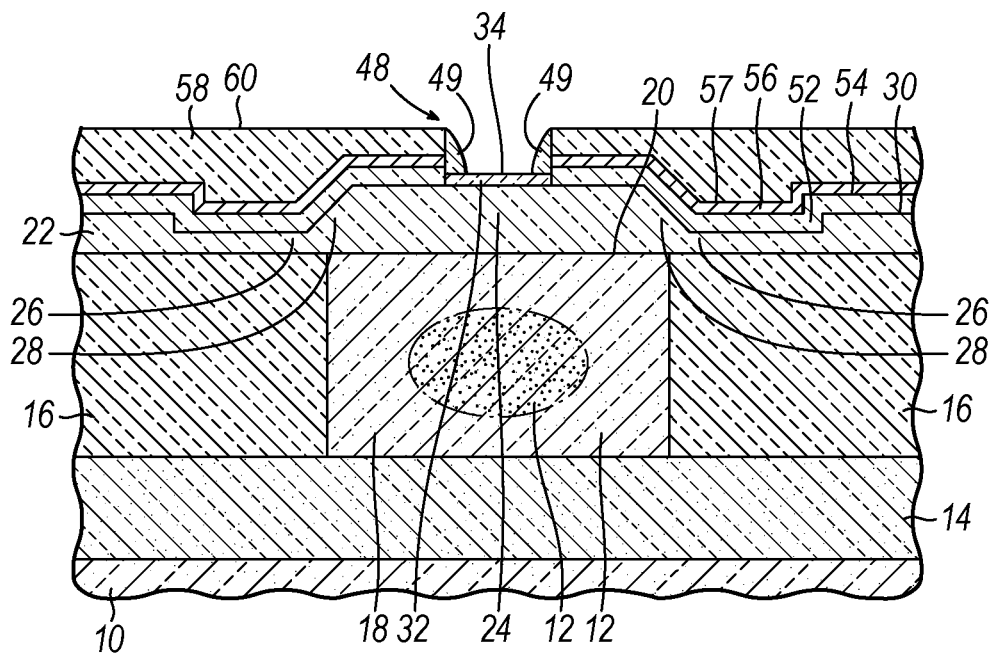

With reference to FIG. 6B in which like reference numerals refer to like features in FIG. 6 and in accordance with an alternative embodiment, spacers 50 may be removed from inside the emitter window 62 (FIG. 7) and replaced by spacers 49 that line the emitter window 62. The spacers 49 may be formed from a dielectric material and in a manner similar to the construction of spacers 50. Alternatively, the spacers 49 may be formed from a layered combination of oxide and polysilicon. The spacers 49 are formed after layer 36 is removed from the layer stack of the sacrificial emitter pedestal 48 but prior to the removal of layer 32 from the layer stack. The replacement of spacers 50 by spacers 49 eliminates any device-related issues (e.g., tunneling) caused by the undercutting of spacers 50. The process flow would continue as described below in connection with FIGS. 7-9.

Figure 7:
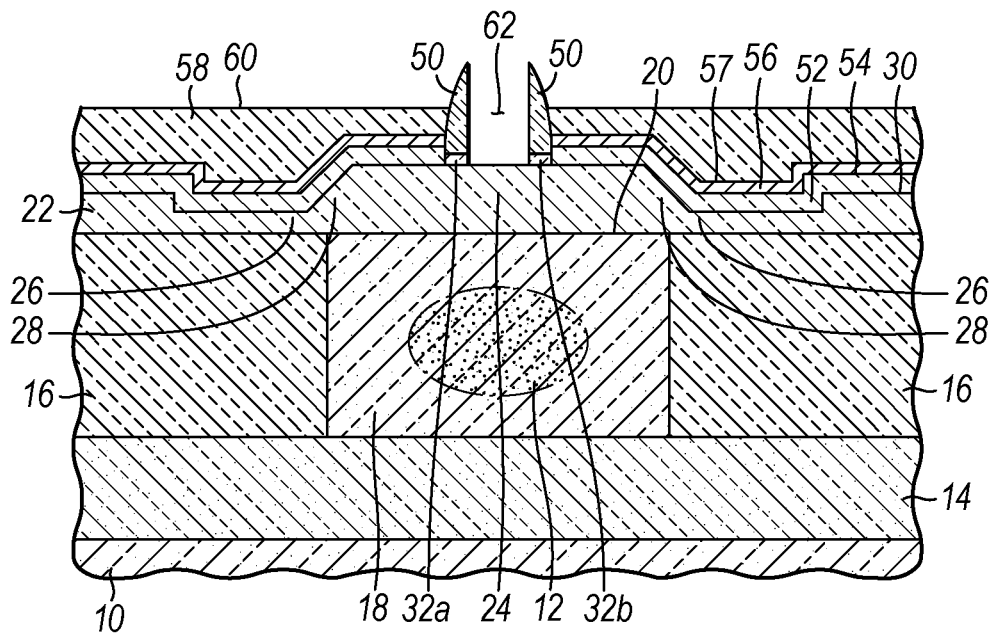

With reference to FIG. 7 in which like reference numerals refer to like features in FIG. 6 and at a subsequent fabrication stage, layer 36 is removed from its position between the spacers 50 of the sacrificial emitter pedestal 48. Layer 36 may be etched using dry etching process. The etching process removes the material of layer 36 selective to the materials of layer 32, spacers 50, and insulating layer 58. The etching process terminates upon reaching the top surface 34 of layer 32.

An emitter window 62 is formed between the spacers 50 and extends to the depth of the top surface 30 of intrinsic base layer 22. Optionally, additional spacers (not shown) may be formed in a conventional manner on the sidewalls bounding the emitter window 62. To form the emitter window 62, a hydrofluoric acid type procedure, either a dilute hydrofluoric (DHF) or a buffered hydrofluoric (BHF) wet procedure, or a COR process is then applied to remove portions of layer 32 not covered by the spacers 50 to minimize undercut of layer 32 underneath the spacers 50.

After the emitter window 62 is opened and, optionally, after layer 36 is removed, the collector region 12 may be formed as a SIC. The spacers 50, which line the emitter window 62, promote the self-alignment of the implantation process in this instance.

With reference to FIG. 8 in which like reference numerals refer to like features in FIG. 7 and at a subsequent fabrication stage, an emitter 64 of the bipolar junction transistor 74 is then formed in the emitter window 62 by depositing a layer comprised of a heavily-doped semiconductor material and then patterning the layer with a lithography and etching process. For example, the emitter 64 may be formed from polysilicon heavily doped with a concentration of a dopant, such as an impurities species from Group V of the Periodic Table (e.g., arsenic) effective to impart an n-type conductivity in which electrons are the majority carriers and dominate the electrical conductivity of the semiconductor material. An optional layer of a dielectric material, such as $Si_3N_4$, may be applied before the emitter 64 is patterned. The emitter 64 directly contacts the top surface 30 of intrinsic base layer 22. The emitter 64 is T-shaped and includes a head that protrudes out of the emitter window 62 and above the top surface 60 of insulating layer 58. The dimensions of the head are primarily determined by a need to provide an overlay margin to ensure that an overlying local interconnect contact lands on the emitter 64.

The lithography process forming emitter 64 from the layer of heavily-doped semiconductor material may utilize a negative photoresist as an etch mask to protect only a strip of the heavily-doped semiconductor material above the portion filling the emitter window 62. An etching process that stops on the material of insulating layer 58 is selected to shape the head of the emitter 64 from the protected strip of heavily-doped semiconductor material. The mask is stripped from the surface after shaping the emitter 64, which exposes a top surface of insulating layer 58 surrounding the head of the emitter 64.

With reference to FIG. 9 in which like reference numerals refer to like features in FIG. 8 and at a subsequent fabrication stage, the layers 22, 52, 58 are patterned using conventional photolithography and etching processes to laterally define an intrinsic base 70 of the bipolar junction transistor 74 from intrinsic base layer 22 and an extrinsic base 72 of the bipolar junction transistor 74 from the residual portions of extrinsic base layer 52, as well as trim the dimensions of the silicide layer 56 disposed between the intrinsic base 70 and extrinsic base 72. Silicide layer 56 is generally only formed inside the extrinsic base area. After patterning, the bipolar junction transistor 74 has a vertical architecture in which the intrinsic base 70 is located between the emitter 64 and the collector region 12, and the emitter 64, intrinsic base 70, and the collector region 12 have a vertical arrangement. The extrinsic base 72 extends laterally to permit contact access to the intrinsic base 70 using the silicide layer 56. The spacers 50 and residual portions 32a, 32b of layer 32 have a thickness to ensure that the emitter 64 is not shorted to the extrinsic base 72.

Insulating layer 58 is removed over regions not masked by the head of the emitter 64 to expose the top surface of the silicide layer 56. Regions of insulating layer 58 form an isolation insulator between the head of the emitter 64 and the silicide layer 56 of extrinsic base 72, as may be the case. Either a dry etching process, like RIE, or a wet chemical etching process, like buffered hydrofluoric acid (BHF), may be used to remove the material of insulating layer 58 selectively to the material of layer 56.

The conductivity types of the semiconductor material constituting the emitter 64 and the semiconductor materials constituting extrinsic base 72 and intrinsic base 70 are opposite. The semiconductor material of the intrinsic base 70, which may be $Si_xGe_{1-x}$ doped with boron and/or carbon, may have a narrower band gap than the materials (e.g., silicon) of the emitter 64 and collector region 12, in which case the bipolar junction transistor 74 has a Si/SiGe heterojunction. The bipolar junction transistor 74 may comprise either an NPN device or a PNP device contingent upon the device doping. The majority of the base current is carried through the raised extrinsic base 72, which decreases the base-collector capacitance and base resistance.

The emitter 64 includes a periphery or perimeter 65 defined by vertically-extending sidewalls that border the emitter window 62. The sacrificial emitter pedestal 48 promotes self-alignment between the perimeter 65 of emitter 64 and the extrinsic base 72 and self-alignment between the perimeter 65 of emitter 64 and the silicide layer 56.

The spacers 50 of the sacrificial emitter pedestal 48 promote the self-alignment of the extrinsic base 72 in cooperation with the utilization of selective epitaxy of the layer comprising the extrinsic base material (e.g., $Si_xGe_{1-x}$). The base/emitter isolation is accomplished by dielectric (e.g., oxide) deposition and then CMP.

The silicide layer 56 is formed in a self-alignment with the intrinsic base 70 from the implementation of the sacrificial emitter pedestal 48 in the process flow. The proximity of the silicide layer 56 to the intrinsic base 70 significantly reduces the composite sheet resistance and, thereby, significantly reduces the base resistance $R_b$. The base resistance $R_b$ is a significant parasitic because it provides an electrical feedback path between the output and input of the bipolar junction transistor 74. The reduction in the base resistance may improve the performance of the bipolar junction transistor 74 by increasing speed of the device, e.g., an important figure of merit, $f_{max}$, which is a function of base resistance $R_b$.

The use of CMP to planarize the dielectric material of insulating layer 58, which supplies base/emitter isolation, is also a distinction over conventional fabrication techniques. The CMP process is also a known and well-characterized CMOS process. The process forming bipolar junction transistor 74 is extendable to more advanced technology nodes, but is also applicable to low-cost technology.

During the front-end-of-line (FEOL) portion of the fabrication process, the device structure of the bipolar junction transistor 74 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors available on the same substrate 10.

Standard back-end-of-line (BEOL) processing follows, which includes formation of contacts and wiring for the local interconnect structure, and formation of dielectric layers, via plugs, and wiring for an interconnect structure coupled by the local interconnect wiring with the bipolar junction transistor 74, as well as other similar contacts for additional device structures like bipolar junction transistor 74 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

Figure 10:
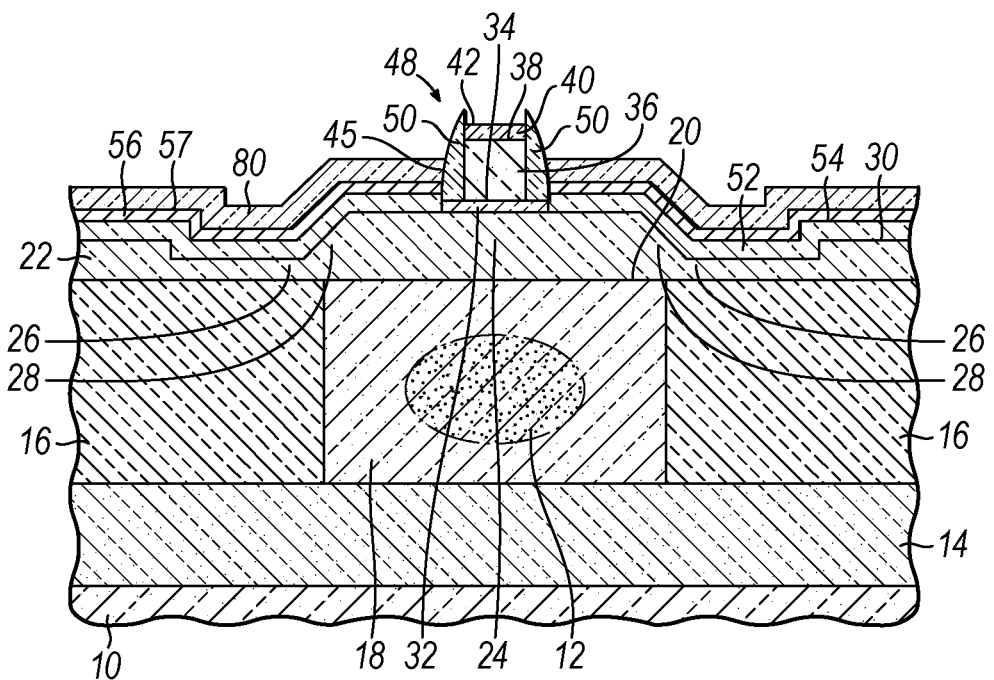
FIGS. 10-12 are cross-sectional views of a portion of a substrate at successive fabrication stages of a processing method for fabricating a device structure in accordance with an alternative embodiment of the invention.

With reference to FIG. 10 in which like reference numerals refer to like features in FIG. 4 and at a subsequent fabrication stage in accordance with an alternative embodiment, a layer 80 of a silicon-containing material is formed on a top surface 57 of the silicide layer 56. The silicon-containing material in layer 80 may be polycrystalline Si or $Si_xGe_{1-x}$ formed by a suitable selective deposition process, such as CVD using either silane or disilane as a silicon source or PVD.

Figure 11:
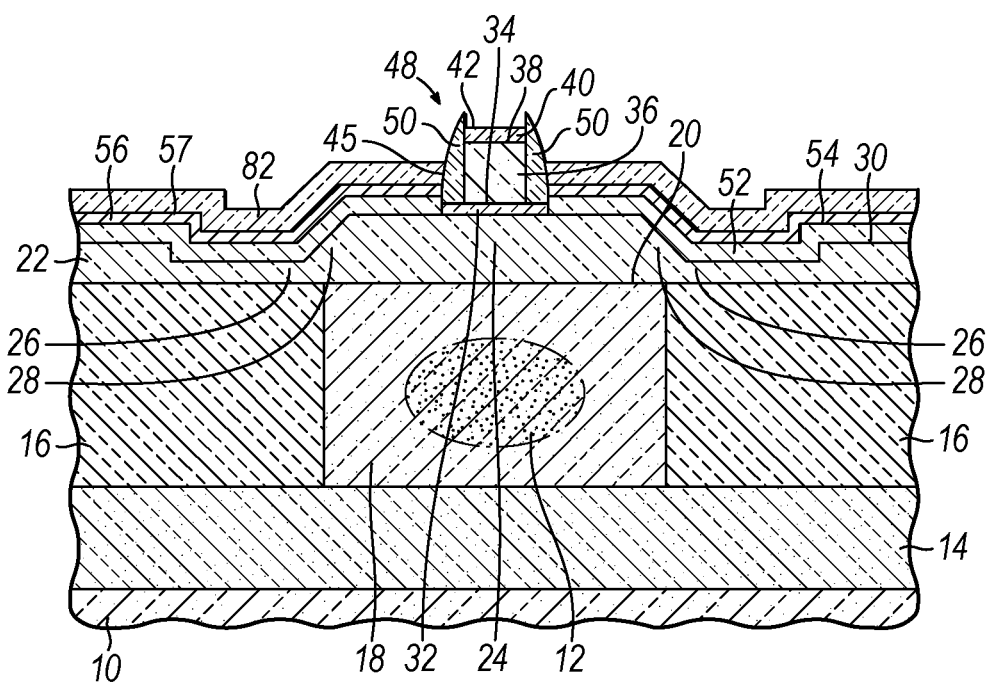

With reference to FIG. 11 in which like reference numerals refer to like features in FIG. 10 and at a subsequent fabrication stage, the polysilicon layer is converted to an insulating layer 82 that is resident on the silicide layer 56. The insulating layer 82 may be formed by subjecting layer 80 to a low temperature oxidation process that is capable of converting polycrystalline Si or $Si_xGe_{1-x}$ into an oxide. The low temperature oxidation process may be performed at a temperature of 700° C. or less or, alternatively, in a range of 400° C. to 750° C. The low temperature oxidation process may be performed in the presence of an oxygen-containing gas or vapor including air, ozone, steam, or a combination thereof, and optionally an inert gas as a diluent. In a representative embodiment, the low temperature oxidation process may be a high pressure oxidation (HIPOX) process performed at an elevated pressure above atmospheric pressure.

Figure 12:
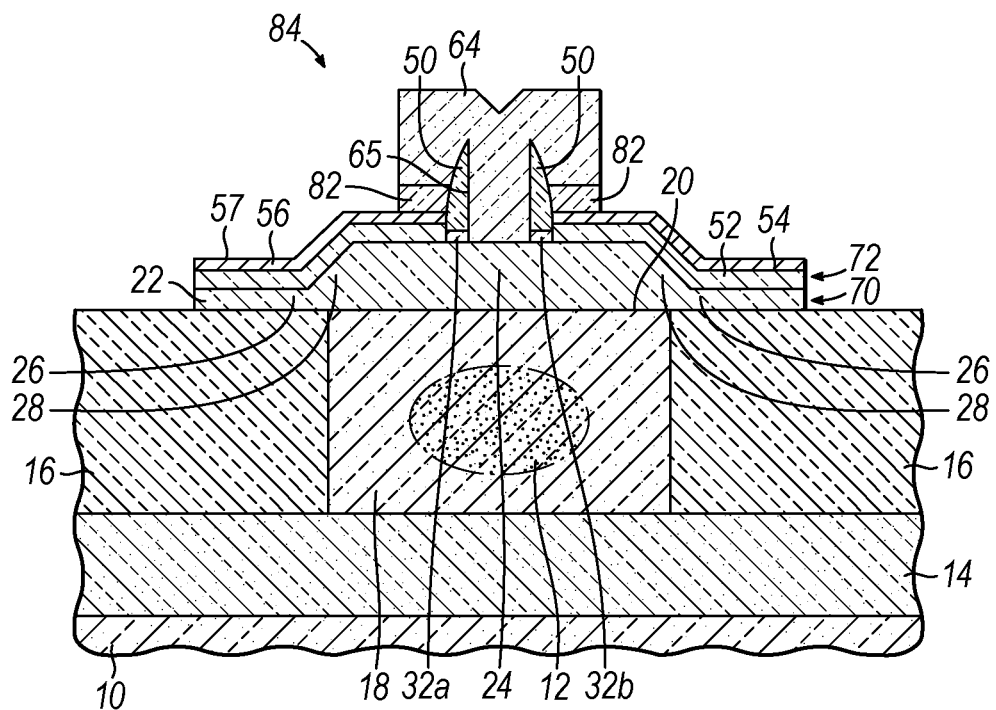

With reference to FIG. 12 in which like reference numerals refer to like features in FIG. 11 and at a subsequent fabrication stage, the process flow is continued similarly to the process flow described for FIGS. 5-9 to produce a bipolar junction transistor 84 that is substantially identical in construction to bipolar junction transistor 74.

Figure 13:
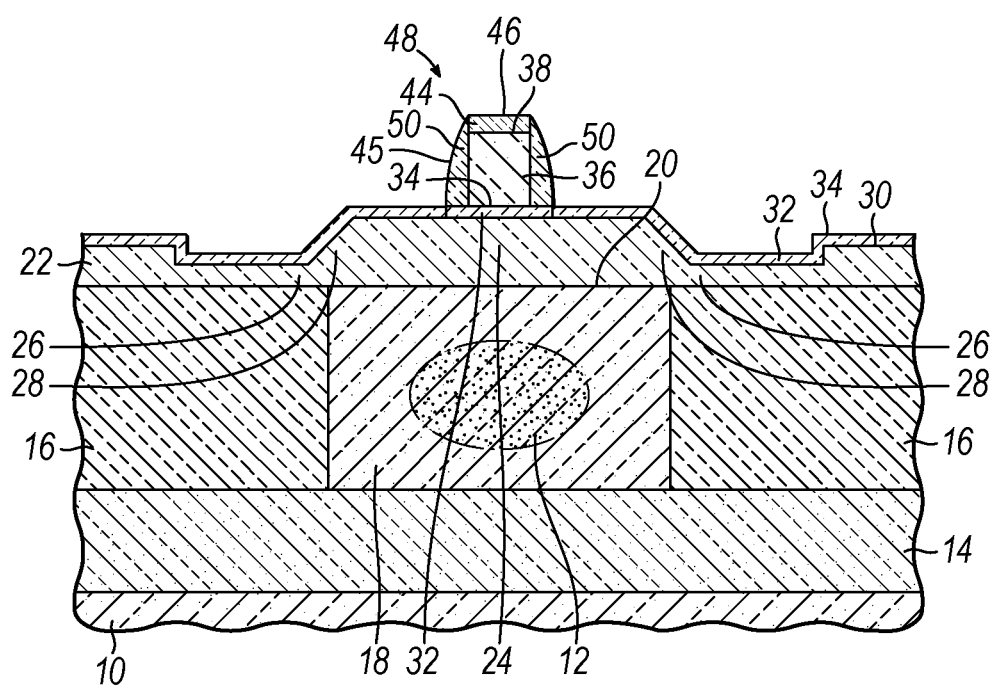
FIGS. 13-17 are cross-sectional views of a portion of a substrate at successive fabrication stages of a processing method for fabricating a device structure in accordance with an alternative embodiment of the invention.

With reference to FIG. 13 in which like reference numerals refer to like features in FIG. 1 and at a subsequent fabrication stage in accordance with an alternative embodiment, the sacrificial emitter pedestal 48 is formed as a sacrificial mandrel by patterning layers 36, 44 of the layer stack 31 using photolithography and subtractive etching processes. When the layer stack 31 is deposited in connection with FIG. 1, layer 44 is deposited on layer 36 in a directly contacting relationship with the top surface 38 of layer 36, and layer 40 is omitted from the layer stack 31. The material (e.g., $SiO_2$) comprising layer 44, which constitutes the cap of the sacrificial emitter pedestal 48, has the same etching selectively as the material (e.g., $SiO_2$) comprising layer 32. Spacers 50 are formed on the sidewalls of the layers 36, 44 as described above.

Figure 14:
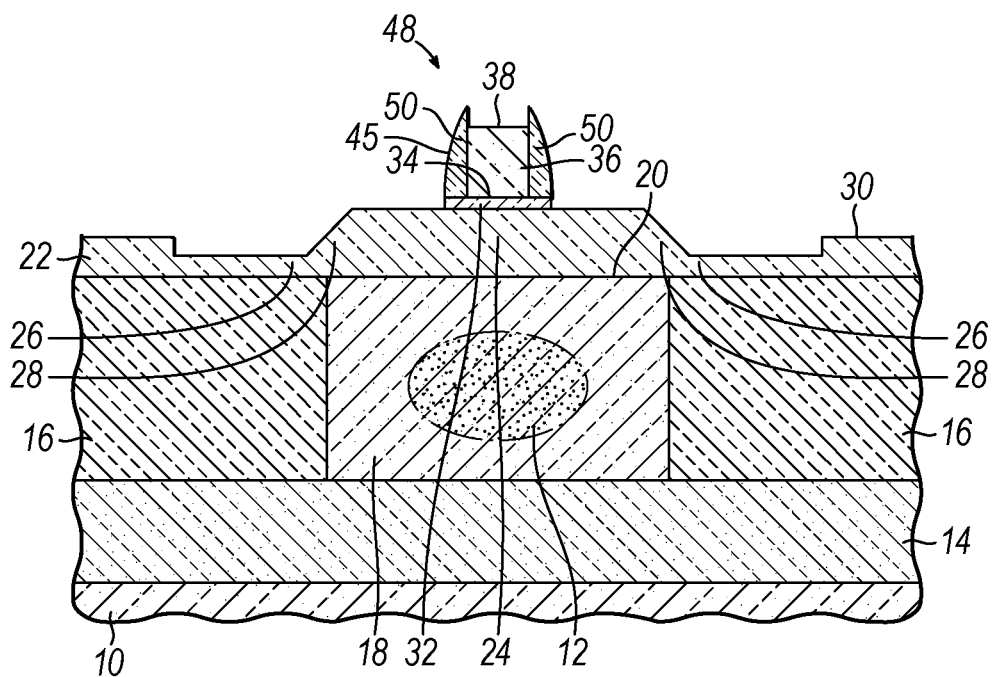

With reference to FIG. 14 in which like reference numerals refer to like features in FIG. 13 and at a subsequent fabrication stage, layer 32 is removed by an etching process, such as chemical oxide removal (COR), as described above in connection with FIG. 3. The etching process also removes the portion of layer 44 capping the sacrificial emitter pedestal 48. Following the conclusion of the etching process, the top surface 30 of intrinsic base layer 22 and the top surface 38 of layer 36 in the sacrificial emitter pedestal 48 are exposed.

Figure 15:
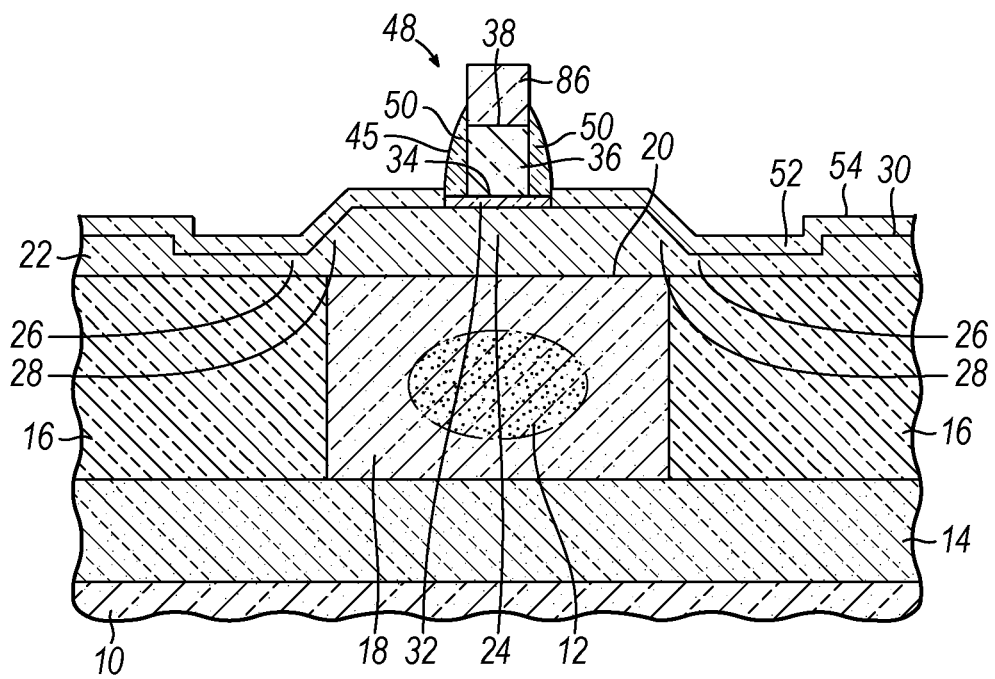

With reference to FIG. 15 in which like reference numerals refer to like features in FIG. 14 and at a subsequent fabrication stage, the extrinsic base layer 52 is formed on the top surface 30 of the intrinsic base layer 22 as described above in connection with FIG. 3. An additive layer 86 of the material comprising extrinsic base layer 52 is also formed on the exposed top surface 38 of layer 36 and becomes a portion of the layer stack of sacrificial emitter pedestal 48. The material comprising additive layer 86 may be comprised of the same material as layer 36 or a material of similar composition to layer 36.

Figure 16:
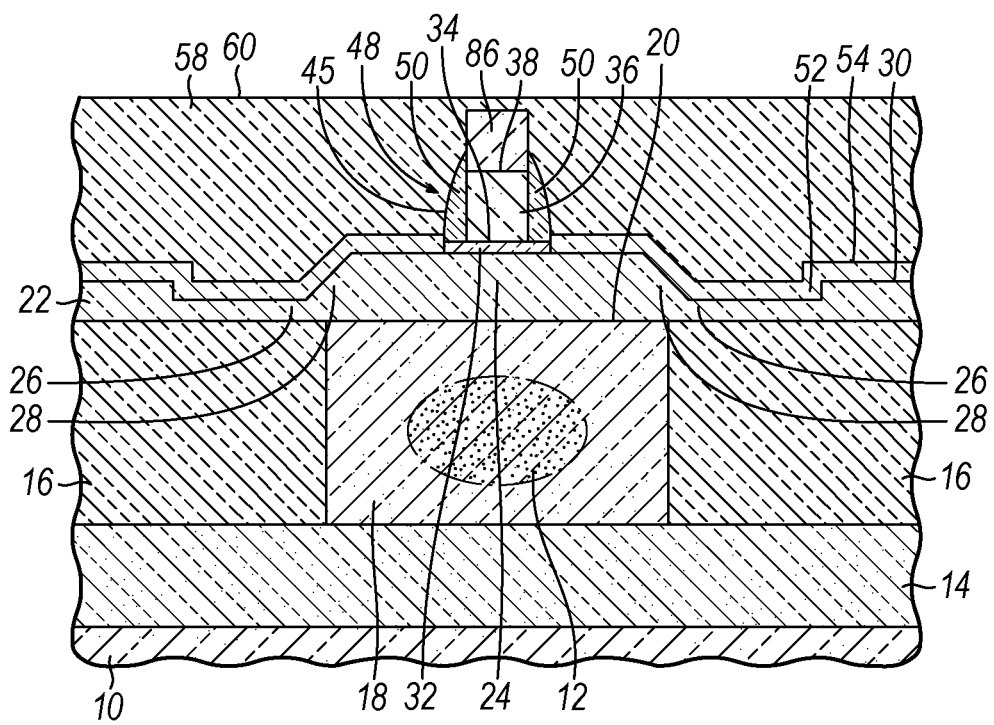

With reference to FIG. 16 in which like reference numerals refer to like features in FIG. 15 and at a subsequent fabrication stage, the insulating layer 58 is deposited to bury the sacrificial emitter pedestal 48 and planarized using a CMP process so that the top surface 60 is flat, as described above in connection with FIG. 5. The CMP process is controlled such that the sacrificial emitter pedestal 48 and the additive layer 86 remain buried.

Figure 17:
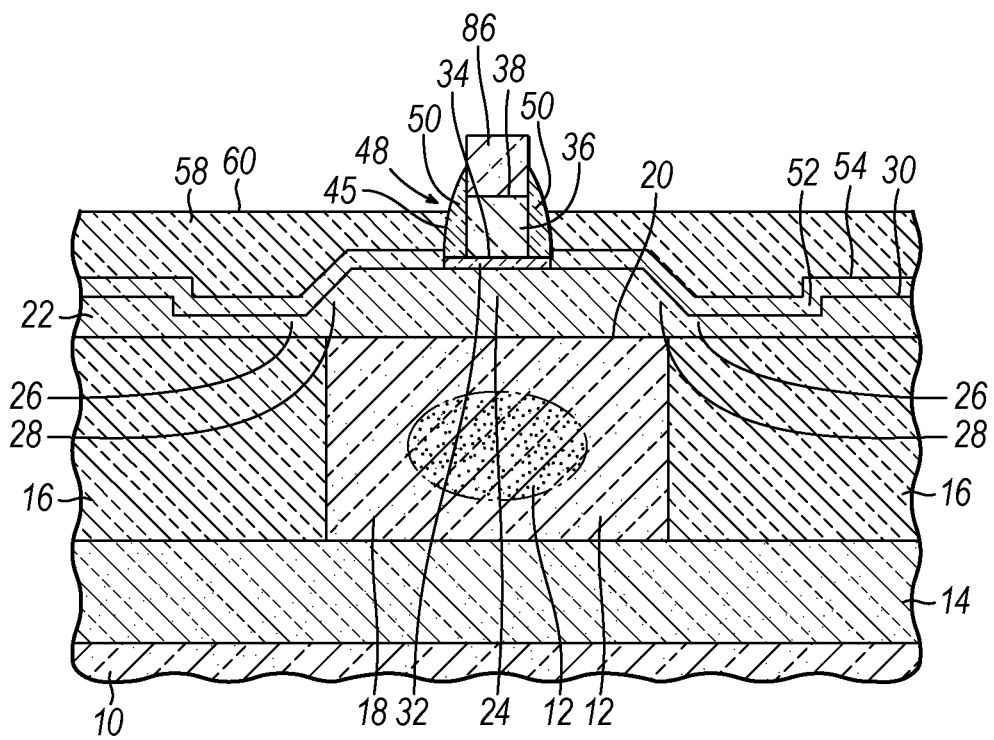

With reference to FIG. 17 in which like reference numerals refer to like features in FIG. 16 and at a subsequent fabrication stage, the top surface 60 of insulating layer 58 is further recessed relative to the sacrificial emitter pedestal 48 by an etching process, such as RIE. Layer 36 and additive layer 86 are then removed to open the emitter window 62 (FIG. 7).

The process flow continues as described for FIGS. 7-9 to produce the bipolar junction transistor 74. In the process flow of this alternative embodiment, however, the silicide layer 56 is formed at a later stage of the process flow together with silicide for other devices including the source and drain of CMOS FETs and the collector of the bipolar junction transistor 74.

Figure 18:
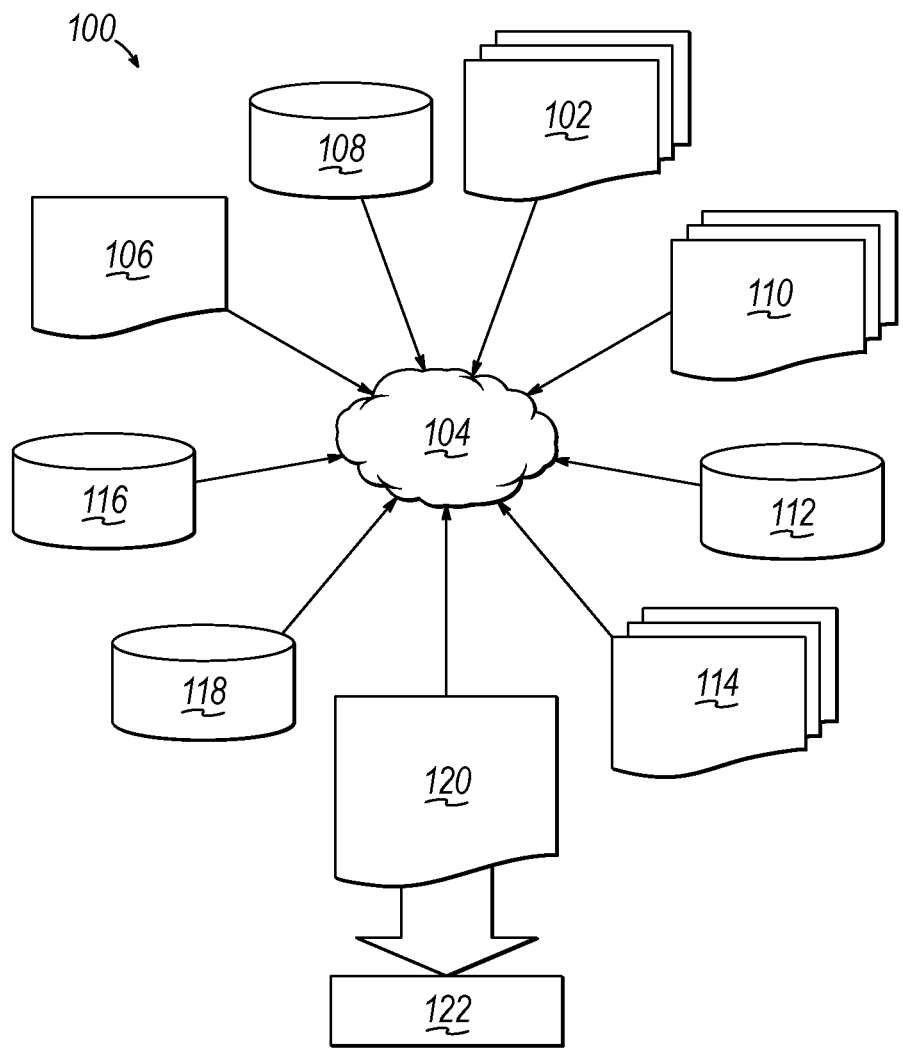
FIG. 18 is a flow diagram of a design process used in semiconductor design, manufacture, and/or test.

FIG. 18 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 9 and FIG. 12. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 9 and FIG. 12. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 9 and FIG. 12 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 9 and FIG. 12. In one embodiment, design structure 120 may comprise a compiled, executable HDL simulation model that functionally simulates the devices shown in FIG. 9 and FIG. 12.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 9 and FIG. 12. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device structure for a bipolar junction transistor, the device structure comprising:
   an intrinsic base including a top surface;
   an extrinsic base on the top surface of the intrinsic base;
   a silicide layer on the extrinsic base;
   a plurality of first spacers having an outer surface, the first spacers oriented to project vertically relative to the top surface of the intrinsic base, the first spacers arranged to line an emitter window therebetween, and the emitter window extending through extrinsic base and the silicide layer to the top surface of the intrinsic base; and
   an emitter including a portion disposed in the emitter window and a head protruding out of the emitter window, the portion of the emitter in contact with the intrinsic base, and the portion of the emitter having a plurality of sidewalls that border the first spacers and that are separated from the extrinsic base and the silicide layer by the first spacers,
   wherein the silicide layer and the extrinsic base each terminate at the outer surface of the first spacers so that the silicide layer and the extrinsic base are aligned relative to each other and relative to the portion of the emitter by the first spacers.

2. The device structure of claim 1 wherein the silicide layer comprises titanium (Ti), cobalt (Co), or nickel (Ni).

3. The device structure of claim 2 wherein the silicide layer comprises semiconductor material from the extrinsic base.

4. The device structure of claim 1 further comprising:
   an insulating layer on the silicide layer, the insulating layer separated from the extrinsic base by the silicide layer.

5. The device structure of claim 1 wherein the extrinsic base directly contacts the top surface of the intrinsic base, and the extrinsic base has an epitaxial relationship with the intrinsic base.

6. The device structure of claim 1 further comprising:
   a plurality of second spacers lining the emitter window, the second spacers disposed between the emitter and the first spacers.

7. The device structure of claim 1 further comprising:
   a plurality of trench isolation regions in a semiconductor substrate that surround a device region; and
   a collector region in the device region, the collector region coupled with the raised region of the intrinsic base and separated from the emitter by the intrinsic base.

8. The device structure of claim 1 further comprising:
a plurality of trench isolation regions in a semiconductor substrate that surround a device region,
wherein the intrinsic base includes a polycrystalline region over the trench isolation regions, the polycrystalline region comprised of polycrystalline semiconductor material and including first sections and second sections having different thicknesses.

9. The device structure of claim 8 wherein the extrinsic base includes a polycrystalline region that combines with the polycrystalline region of the intrinsic base to fill open spaces between the first sections to reduce the different thicknesses.

10. The device structure of claim 9 wherein the extrinsic base is comprised of $Si_xGe_{1-x}$.

11. The device structure of claim 1 further comprising:
an insulating layer on the silicide layer.

12. The device structure of claim 11 wherein the insulating layer has a top surface, and the first spacers project above the top surface of the insulating layer.

13. A hardware description language (HDL) design structure encoded on a machine-readable data storage medium, the HDL design structure comprising elements that when processed in a computer-aided design system generates a machine-executable representation of a bipolar junction transistor, the HDL design structure comprising:
an intrinsic base including a top surface;
an extrinsic base on the top surface of the intrinsic base;
a silicide layer on the extrinsic base;
a plurality of first spacers having an outer surface, the first spacers oriented to project vertically relative to the top surface of the intrinsic base, the first spacers arranged to line an emitter window therebetween, and the emitter window extending through extrinsic base and the silicide layer to the top surface of the intrinsic base; and
an emitter including a portion disposed in the emitter window and a head protruding out of the emitter window, the portion of the emitter in contact with the intrinsic base, and the portion of the emitter having a plurality of sidewalls that border the first spacers and that are separated from the extrinsic base and the silicide layer by the first spacers,
wherein the silicide layer and the extrinsic base each terminate at the outer surface of the first spacers so that the silicide layer and the extrinsic base are aligned relative to each other and relative to the portion of the emitter by the first spacers.

14. The HDL design structure of claim 13 wherein the HDL design structure comprises a netlist.

15. The HDL design structure of claim 13 wherein the DHL design structure resides on storage medium as a data format used for the exchange of layout data of integrated circuits.

16. The HDL design structure of claim 13 wherein the HDL design structure resides in a programmable gate array.

* * * * *